(12) United States Patent
Fink

(10) Patent No.: US 9,244,131 B2
(45) Date of Patent: Jan. 26, 2016

(54) METHOD FOR DETERMINING THE INTERNAL OHMIC RESISTANCE OF A BATTERY MODULE, BATTERY MANAGEMENT SYSTEM AND MOTOR VEHICLE

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/405,849

(22) PCT Filed: May 24, 2013

(86) PCT No.: PCT/EP2013/060742
§ 371 (c)(1),
(2) Date: Dec. 5, 2014

(87) PCT Pub. No.: WO2013/182434
PCT Pub. Date: Dec. 12, 2013

(65) Prior Publication Data
US 2015/0177332 A1  Jun. 25, 2015

(30) Foreign Application Priority Data
Jun. 8, 2012  (DE) .................. 10 2012 209 652

(51) Int. Cl.
*G01R 31/36* (2006.01)
*B60L 11/18* (2006.01)
*H02J 7/00* (2006.01)

(52) U.S. Cl.
CPC ......... *G01R 31/3662* (2013.01); *B60L 11/1803* (2013.01); *B60L 11/1861* (2013.01);
(Continued)

(58) Field of Classification Search
CPC . G01R 31/3662; G01R 31/3658; H02J 7/007;
B60L 11/1864; B60L 11/1861; B60L 11/1803;
B60L 2240/549; B60L 2240/547; Y02T 10/7011; Y02T 10/7005; Y02T 10/7061; Y02T 10/7044
See application file for complete search history.

(56) References Cited

U.S. PATENT DOCUMENTS

| | | | |
|---|---|---|---|
| 5,642,275 A | 6/1997 | Peng et al. | |
| 6,094,030 A * | 7/2000 | Gunthorpe | H01M 10/425 320/116 |

(Continued)

FOREIGN PATENT DOCUMENTS

| | | |
|---|---|---|
| DE | 195 46 553 C1 | 5/1997 |
| DE | 10 2009 002 465 A1 | 10/2010 |

(Continued)

OTHER PUBLICATIONS

Noworolski et al.; Monitoring of multicell battery string with single sensing wire; Telecommunications Energy Conference, 1994, INTELEC '94; pp. 486-490; Oct. 1994.*

(Continued)

*Primary Examiner* — Michael J Zanelli
(74) *Attorney, Agent, or Firm* — Maginot, Moore & Beck LLP

(57) ABSTRACT

A method for determining an internal ohmic resistance of a first battery module includes measuring a first voltage intensity of the first battery module. The first battery module is connected to at least one second battery module subject to a current load after obtaining the first voltage intensity. A second voltage intensity of the first battery module is measured after the connection of the first battery module. The internal ohmic resistance is determined with reference to the first voltage intensity and the second voltage intensity.

10 Claims, 2 Drawing Sheets

(52) U.S. Cl.
CPC ............. *B60L11/1864* (2013.01); *H02J 7/007* (2013.01); *B60L 2240/547* (2013.01); *B60L 2240/549* (2013.01); *G01R 31/3658* (2013.01); *Y02T 10/7005* (2013.01); *Y02T 10/7011* (2013.01); *Y02T 10/7044* (2013.01); *Y02T 10/7061* (2013.01)

(56) References Cited

U.S. PATENT DOCUMENTS

| | | | |
|---|---|---|---|
| 6,583,603 | B1 | 6/2003 | Baldwin |
| 6,922,058 | B2 * | 7/2005 | Potempa ............ G01R 31/3662 320/149 |
| 2010/0250163 | A1 | 9/2010 | Maegawa et al. |
| 2011/0298626 | A1 | 12/2011 | Fechalos et al. |
| 2012/0119745 | A1 * | 5/2012 | Deveau ............. G01R 31/3631 324/429 |
| 2014/0306712 | A1 * | 10/2014 | Esnard-Domerego G01R 31/3679 324/430 |

FOREIGN PATENT DOCUMENTS

| | | |
|---|---|---|
| DE | 10 2010 052 934 A1 | 5/2012 |
| DE | 10 2011 003 690 A1 | 8/2012 |
| WO | 00/42690 A1 | 7/2000 |

OTHER PUBLICATIONS

International Search Report corresponding to PCT Application No. PCT/EP2013/060742, mailed Aug. 30, 2013 (German and English language document) (7 pages).

* cited by examiner

METHOD FOR DETERMINING THE INTERNAL OHMIC RESISTANCE OF A BATTERY MODULE, BATTERY MANAGEMENT SYSTEM AND MOTOR VEHICLE

This application is a 35 U.S.C. §371 National Stage Application of PCT/EP2013/060742, filed on May 24, 2013, which claims the benefit of priority to Serial No. DE 10 2012 209 652.3, filed on Jun. 8, 2012 in Germany, the disclosures of which are incorporated herein by reference in their entirety.

The present disclosure relates to a method for determining the internal ohmic resistance of a battery module comprising at least one battery cell, for example a lithium-ion battery cell, as is used for example in traction batteries of electric or hybrid motor vehicles, that is to say in motor vehicles having drives that are at least partly or intermittently electrically driven. The disclosure therefore also relates to a motor vehicle and a battery management system.

BACKGROUND

Due to improved storage capacity, more frequent rechargeability and higher energy densities, there is an increasingly broad range of applications for batteries. Batteries with lower energy storage capacity are used for example for small portable electronic devices, such as mobile telephones, laptops, camcorders and the like, whereas batteries with high capacity are used as an energy source for the drive of motors of hybrid or electric vehicles, etc. or as stationary batteries.

Batteries can be formed for example by the series connection of battery modules, wherein parallel connections of the battery modules are also used in part and the battery modules may in turn consist of battery cells connected in series and/or parallel.

For the drive of motors of hybrid or electric vehicles, multi-phase battery systems in particular are suitable and are also referred to as battery direct inverters (BDIs). Multi-phase battery systems comprise at least two battery module banks connected in parallel, each bank comprising one or more battery modules connected in series. Here, the battery modules have a coupling unit and can be connected and disconnected individually with the aid of said coupling unit, sometimes also with the possibility of choosing between a positive and negative connection. By connecting and disconnecting the modules accordingly, the multi-phase battery system can therefore be used to generate a number of alternating voltages phase-shifted in relation to one another. With suitable design, three alternating voltage profiles phase-shifted in relation to one another can be generated for example, which each approximate a sine curve and can be used directly to drive electric or hybrid motors.

Battery management systems are used for battery management, for example for the basic control of modules, in order to increase the safety of batteries, in order to increase efficiency and in order to extend the service life of battery modules and battery systems composed of battery modules. One purpose of battery management systems is to determine the current state of the battery modules. The information which is key for this purpose includes the impedance or the internal ohmic resistance of the battery module or of the battery cells contained in the battery module, wherein the impedance is dependent on the state of charge, the temperature and the aging of the battery cells.

According to the prior art, associated measurements are taken outside the normal operation of the battery. For example, it is proposed in ISO 12405 to subject batteries that are to be tested to pulsed charging and discharging currents for periods of time lasting for a matter of seconds and to measure the voltage across the battery before and after the current pulse. The impedance is then given as the ratio of the difference of the measured voltages to the strength of the current pulse.

Since the current pulses are applied for one or more seconds, the two voltage measurements are also distanced from one another by this period.

SUMMARY

In accordance with the disclosure a method as claimed in claim 1 for determining the internal ohmic resistance of a battery module is provided. Here, the method comprises the steps of determining the internal ohmic resistance from measurements of voltage intensities. The disclosure is characterized in that the method comprises the connection of the battery module to at least one further battery module that is subject to a load current, wherein the method comprises the measurement of voltage intensities of the battery module before and after the connection.

This enables a much prompter and almost simultaneous measurement of voltage intensities, which in turn enables an improved determination of the actual state of wear of the battery module and prediction of the durability of individual battery cells or of battery modules. The connection can be a connection in series or in parallel.

In accordance with the disclosure, a battery management system for a battery module bank comprising at least two battery modules, which can be connected and disconnected in series positively and/or negatively, according to claim 5 is also proposed. Here, the battery module bank comprises a device for measuring battery module voltage intensities and a device for transmitting measured voltage intensities to the battery management system. The battery management system is designed to determine a change of the transmitted battery module voltage intensities of one of the at least two battery modules as a result of a connection of the first-mentioned battery module to another of the at least two battery modules under load current and to use this change to determine an impedance of the first-mentioned battery module.

The battery modules, in one exemplary embodiment, may be part of a battery bank of a multi-phase battery system comprising at least two parallel battery banks, wherein the multi-phase battery system is suitable, with the aid of the at least two parallel battery banks, for providing two alternating voltages phase-shifted in relation to one another.

In one embodiment of the method, the measurements can thus be taken within the scope of a connection of the battery module during the generation of the alternating voltage.

In another embodiment, the determined internal ohmic resistance is compared with a predefined internal ohmic resistance in order to determine a deviation.

A state of excessive wear of the battery module can thus be detected and is expressed in a deviation from a target impedance behavior.

Insofar as the multi-phase battery system is suitable for generating alternating voltages having at least two different alternating voltage profiles, the method, in a further embodiment, may comprise the determination of an internal ohmic resistance over time from measured alternating voltage profiles and measured current profiles and a comparison of the determined internal ohmic resistance profile with an internal ohmic resistance profile fixed by one of the two alternating voltage profiles in order to determine a deviation profile. The deviation profile is then deemed to be an indicator for a state of excessive wear of the battery module if it exceeds a threshold value in at least two measurement points.

This enables a continuous monitoring of the multi-phase battery system.

In accordance with the disclosure, a multi-phase battery system as claimed in claim 9 is therefore presented.

The multi-phase battery system comprises a battery management system in the sense of the disclosure and at least two parallel battery module banks, wherein the multi-phase battery system is suitable, with the aid of the at least two parallel battery module banks, for providing alternating voltages phase-shifted in relation to one another and thus a predetermined alternating current intensity.

This multi-phase battery system is particularly suitable for use in a motor vehicle.

In accordance with the disclosure, a motor vehicle as claimed in claim 10 is therefore also presented.

In one embodiment of the motor vehicle, current intensity measurements and voltage intensity measurements are taken with the necessary frequency and precision in order to determine the state of wear of the battery modules during running operation of the multi-phase battery system as traction battery of the motor vehicle.

Advantageous developments of the disclosure are specified in the dependent claims and described in the description.

BRIEF DESCRIPTION OF THE DRAWINGS

Exemplary embodiments of the disclosure will be explained in greater detail on the basis of the drawings and the following description, in which.

DETAILED DESCRIPTION

The present disclosure has been presented within the scope of the development of a multi-phase battery system for electric or hybrid motor vehicles and will be described hereinafter on the basis of this exemplary embodiment. The disclosure, however, is not limited to this exemplary embodiment, but can be used advantageously in all battery systems consisting of a number of battery modules that allow a connection under load. In particular, the purpose of the battery system is irrelevant for the disclosure.

Figure 1:
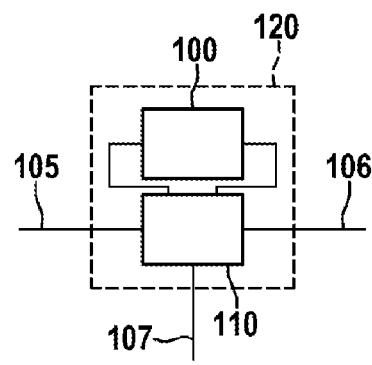
FIG. 1 shows an exemplary battery module, on which the disclosure can be used.

FIG. 1 shows an exemplary battery module 100 with a coupling unit 110. The coupling unit 110 is either an integral part of the battery module 100 or, as shown in FIG. 1, is part of a system 120 comprising the battery module 100. The coupling unit 110 makes it possible at least to connect and disconnect the battery module 100, that is to say to separate said battery module at least from one of the terminals 105 and 106 of the system 120. The terminals 105 and 106 of the system 120 are also referred to as battery module poles. The coupling unit 110 of the illustrated example can be controlled for this purpose via a signal input 107. However, it is also possible for the coupling unit 110 to connect and disconnect the module with a predetermined frequency without external control. A square wave voltage can thus be produced. The coupling unit 110 additionally makes it possible to fix the polarity upon connection, thus enabling production of a square wave alternating voltage.

Figure 2:
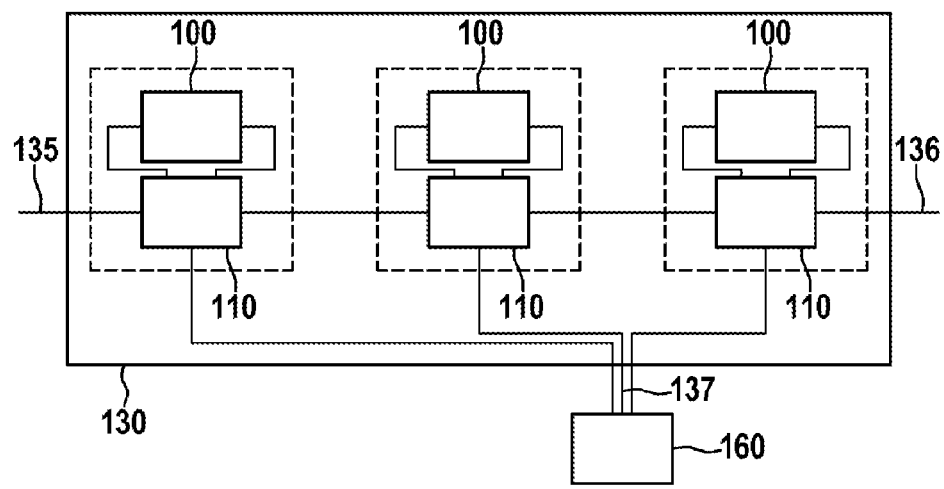
FIG. 2 shows an exemplary battery module bank, on which the disclosure can be used.

If a number of such modules 100 or systems 120 are now arranged in series in a battery module bank 130, as shown in FIG. 2, and are connected and disconnected repeatedly in a manner offset over time, an approximately sinusoidal voltage curve of a voltage between the terminals 135 and 136 of the battery module bank 130 can thus be produced. The terminals 135 and 136 of the battery module bank 130 are also referred to as battery bank terminals or battery bank poles. Under load, a current curve corresponding to the voltage curve is produced.

In an exemplary embodiment (not shown), all modules combined in a bank are connected and disconnected via a single, common coupling unit. This can be designed to generate an alternating voltage with predetermined frequency. Or, it may be an alternating voltage with variable frequency, if there is a possibility of controlling the common coupling unit in order to vary the frequency.

Figure 3:
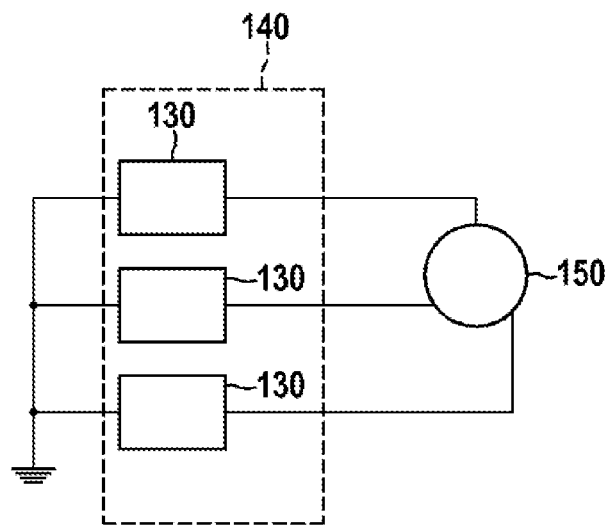
FIG. 3 shows an exemplary multi-phase battery system, on which the disclosure can be used.

FIG. 3 shows an exemplary multi-phase battery system 140, in which three battery module banks 130 are arranged parallel to one another. By controlling the coupling units 110, the modules 100 in each of the banks 130 are connected such that the respective bank 130 provides an approximately sinusoidal alternating voltage. Here, the alternating voltages of the individual banks 130 have a phase shift in relation to one another, for example of a third of a period. The multi-phase battery system 140 is therefore suitable for generating a rotating field, with which an electric or hybrid motor 150 can be driven directly. By changing the amplitudes of the provided alternating voltages and/or the phase shifts in relation to one another, the current curve in the banks and therefore a torque can additionally be adapted to a predefined target power of the motor 150.

Under load, each of these connection operations generates a current surge or pulse in the connected battery module 100, since the current already flowing through the bank 130 prior to the connection now also flows through the newly connected module 100.

As a result of this current surge or pulse, the module voltage of battery cells combined in the module 100 and therefore also the voltage of the module 100 changes. The time frame within which this change occurs is determined here crucially by the connection and is considerably less than a second. An accurate measurement of an instant voltage change is therefore possible.

The impedance of the connected module can therefore be determined from the ratio of voltage change to current intensity with the aid of the measurement of the voltage change at the module 100 as a result of the connection and also the current intensity of the current flowing through the module at the moment of connection.

This determination is thus possible during running operation, under load and at a frequency that corresponds to a frequency of connection operations. If the measured impedance changes during operation, without change to the predefined target power of the motor 150, this is thus an indication of an aging process of the module in question. It is also possible to store corresponding target impedances in a memory unit of a battery management system at different predefinable target powers of the motor 150. A deviation of an impedance, determined at a given target power from measurements, from the target impedance stored in the memory unit for the given target power can then be an indication for a change of battery cells in the module.

Furthermore, if connections of modules 100 to the associated bank 130 are made in different phase positions of the current, that is to say at different current intensities, an impedance profile can be determined for one, more, or all modules of the bank 130. Insofar as such an impedance profile changes during operation, without change to the predefined target power of the motor 150, this is an indication of an aging process of the module in question. It is also possible to store corresponding target impedance profiles in the memory unit. Again, a deviation of the measured impedance profile from the target impedance profile may be an indication for module aging.

In an exemplary embodiment that is not shown, all modules combined in a multi-phase battery system are connected and disconnected via a single, common coupling unit.

Figure 4:
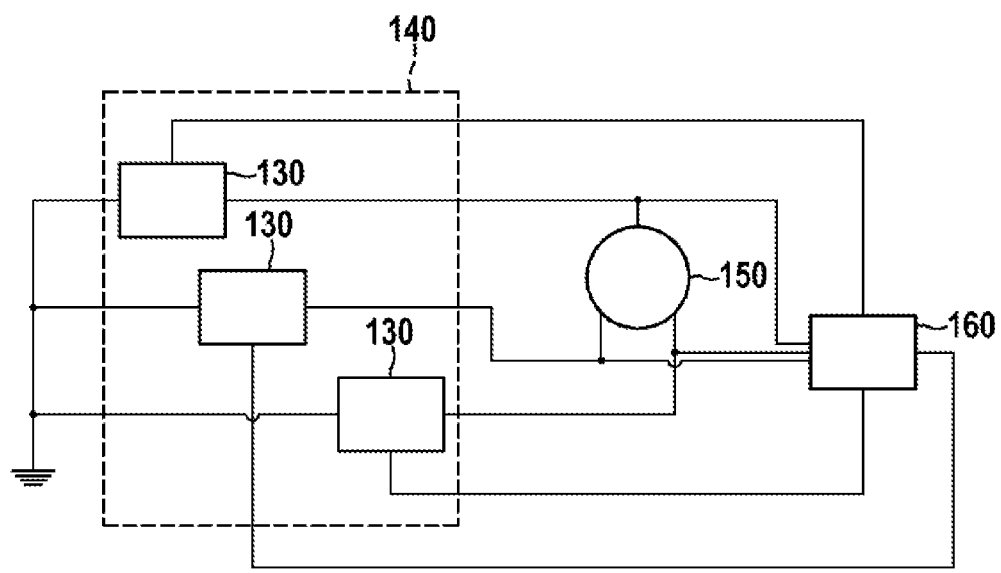
FIG. 4 shows an exemplary battery management system according to the disclosure.

FIG. 4 shows an exemplary battery management system 160 in conjunction with the exemplary multi-phase battery system 140 shown in FIG. 3. The battery management system 160 detects the alternating voltages and the flowing currents provided from the battery module banks 130 to the motor 150 and controls the modules 100 or systems 120 arranged in the banks 130 via connections to the banks 130.

The disclosure thus allows a quasi-continuous monitoring of the module states during running operation. This makes it possible to quickly and reliably identify efficiency losses or even defects of modules. This is advantageous because the modules identified as defective or aging can be replaced and because disturbances of the power provided by the battery bank caused by the defective or aging module can be compensated for, at least in part, by appropriate modification of the control of the coupling units.

The invention claimed is:

1. A method for determining an internal ohmic resistance of a first battery module, comprising:
   measuring a first voltage intensity of the first battery module;
   connecting, after obtaining the first voltage intensity, the first battery module to a second battery module subject to a load current;
   measuring a second voltage intensity of the first battery module after the connection of the first battery module; and
   determining the internal ohmic resistance with reference to the first voltage intensity and the second voltage intensity.

2. The method as claimed in claim 1, further comprising:
   comparing the determined internal ohmic resistance with a predefined internal ohmic resistance to determine a deviation.

3. The method as claimed in claim 1, wherein the connection of the first battery module further comprises:
   connecting the first battery module to the second battery module in series positively or negatively to form a battery module bank configured to generate an alternating voltage, wherein the first voltage intensity and the second voltage intensity are obtained during the generation of the alternating voltage.

4. The method as claimed in claim 3, further comprising:
   determining a first internal ohmic resistance profile by using the determined internal ohmic resistance over time; and
   comparing the determined internal ohmic resistance profile with a second internal ohmic resistance profile fixed by one of two alternating voltage profiles to determine a deviation profile, wherein a plurality of battery module banks are included in a battery system, the battery system is configured to generate alternating voltages having the at least two different alternating voltage profiles and the deviation profile is an indicator for a state of excessive wear of the battery module if the deviation profile exceeds a threshold value in at least two measurement points.

5. A battery management system connected to a battery module bank, wherein the battery module bank includes:
   at least two battery modules configured to be connectable and disconnectable in series at least one of positively and negatively;
   a first device configured to measure battery module voltage intensities; and
   a second device configured to transmit the measured module voltage intensities to the battery management system, and
   wherein the battery management system is configured to:
   determine a change of the transmitted battery module voltage intensities of a first battery module of the at least two battery modules in response to a connection of the first battery module of the at least two battery modules compared with a disconnection of a second battery module of the at least two battery modules to at least a third battery module of the at least two battery modules under load current;
   determine an impedance of the first battery module of the at least two battery modules based on the determined change of the transmitted battery module voltage intensities.

6. The battery management system as claimed in claim 5, wherein the battery management system is further configured to:
   determine a deviation by comparing the determined change of the module voltage intensities with a predefined module voltage intensity change; and
   compare the determined deviation with a threshold value.

7. The battery management system as claimed in claim 5, wherein the battery management system is further configured to:
   determine the change in the module voltage intensities in response to a connection of the at least two battery modules during the generation of an alternating voltage, wherein the battery module bank is configured to generate an alternating voltage by connecting the at least two battery modules.

8. The battery management system as claimed in claim 7, wherein the battery management system is further configured to:
   determine an impedance profile over time; and
   compare the impedance profile with a target impedance profile determined by one of two alternating voltage intensity profiles to determine a deviation profile, wherein the battery module bank is further configured to generate alternating voltages having the at least two different alternating voltage intensity profiles and the deviation profile is an indicator for a state of excessive wear of the battery module if the deviation profile exceeds a threshold value in at least two measurement points.

9. A multi-phase battery system comprising;
   at least two parallel battery module banks, wherein each of the battery module banks includes:
   at least two battery modules configured to be connectable and disconnectable in series at least one of positively and negatively;
   a first device configured to measure battery module voltage intensities; and
   a second device configured to transmit the measured module voltage intensities to a battery management system; and the battery management system connected to the at least two battery modules, wherein the battery management system is configured to:
- determine a change of the transmitted battery module voltage intensities of a first battery module of the at least two battery modules in response to a connection of the first battery module of the at least two battery modules compared with a disconnection of a second battery module of the at least two battery modules to at least a third battery module of the at least two battery modules under load current; and
- determine an impedance of the first battery module of the at least two battery modules based on the determined change of the transmitted battery module voltage intensities, wherein the multi-phase battery system is configured to provide alternating voltages phase-shifted in relation to each of the at least two parallel battery module banks and a predetermined alternating current intensity by using the at least two parallel battery module banks.

10. The multi-phase battery system of claim 9, wherein the multi-phase battery system is comprised by a drive unit of a motor vehicle, the drive unit is configured to be electrically operated at least intermittently or partly.

* * * * *